United States Patent
Lin et al.

(10) Patent No.: US 11,778,766 B2
(45) Date of Patent: Oct. 3, 2023

(54) CASING AND MANUFACTURING METHOD THEREOF

(71) Applicant: Acer Incorporated, New Taipei (TW)

(72) Inventors: Wen-Hsin Lin, New Taipei (TW); Cheng-Nan Ling, New Taipei (TW); Wen-Chieh Tai, New Taipei (TW)

(73) Assignee: Acer Incorporated, New Taipei (TW)

( * ) Notice: Subject to any disclaimer, the term of this patent is extended or adjusted under 35 U.S.C. 154(b) by 337 days.

(21) Appl. No.: 17/087,634

(22) Filed: Nov. 3, 2020

(65) Prior Publication Data

US 2021/0378118 A1 Dec. 2, 2021

(30) Foreign Application Priority Data

May 26, 2020 (TW) ................. 109117484

(51) Int. Cl.
*H05K 5/04* (2006.01)
*B23K 26/362* (2014.01)
*B24B 19/02* (2006.01)
*C25D 13/20* (2006.01)

(52) U.S. Cl.
CPC ............. *H05K 5/04* (2013.01); *B23K 26/362* (2013.01); *B24B 19/02* (2013.01); *C25D 13/20* (2013.01)

(58) Field of Classification Search
CPC ........ H05K 5/04; H05K 5/069; B23K 26/362; B24B 19/02; C25D 13/20; C25D 13/12; H04M 1/0283; H04M 1/0202
See application file for complete search history.

(56) References Cited

FOREIGN PATENT DOCUMENTS

| CN | 101870229 A | * | 10/2010 | |
|----|----|----|----|----|
| CN | 102216492 | | 10/2011 | |
| CN | 102724840 | | 10/2012 | |
| CN | 103305894 | | 9/2013 | |
| CN | 103668226 | | 3/2014 | |
| CN | 104099655 | | 10/2014 | |
| CN | 106926627 | | 7/2017 | |
| CN | 110248753 | | 9/2019 | |
| KR | 20120063939 | | 6/2012 | |
| TW | 328527 B1 | * | 8/2010 | |
| TW | I515333 | | 1/2016 | |
| TW | 202019262 | | 5/2020 | |
| WO | 2018076389 | | 5/2018 | |
| WO | WO-2020197557 A1 | * | 10/2020 | ............. B32B 15/08 |

OTHER PUBLICATIONS

English translation of CN 101870229 (Year: 2010).*
English translation of TWI328527 (Year: 2010).*

* cited by examiner

*Primary Examiner* — Jun S Yoo
(74) *Attorney, Agent, or Firm* — JCIPRNET

(57) ABSTRACT

A manufacturing method of a casing including the following steps is provided. A magnesium alloy substrate is provided first. Next, a protective film is formed on the magnesium alloy substrate. A grinding treatment, a cutting treatment, or an engraving treatment is then performed to remove portions of the protective film and portions of the magnesium alloy substrate. An electrophoretic coating treatment is performed afterwards to form a light-transmissive coating layer covering the protective film and the magnesium alloy substrate. A casing is also provided.

7 Claims, 3 Drawing Sheets

CASING AND MANUFACTURING METHOD THEREOF

CROSS-REFERENCE TO RELATED APPLICATION

This application claims the priority benefit of Taiwan application serial no. 109117484, filed on May 26, 2020. The entirety of the above-mentioned patent application is hereby incorporated by reference herein and made a part of this specification.

BACKGROUND

Technical Field

The disclosure relates to a casing, and in particular, to a casing and a manufacturing method thereof.

Description of Related Art

For the purpose of satisfying the trend of light and thin electronic products, magnesium alloy is widely applied in the manufacturing of casings thanks to its advantages and characteristics such as light weight, favorable strength, and good heat dissipation and electromagnetic shielding capabilities. In the process of manufacturing a magnesium alloy casing, the surface of the magnesium alloy casing is required to be treated through the micro-arc oxidation treatment or the conversion coating treatment to form a protective film on the surface of the magnesium alloy casing, and in this way, erosion may be prevented from occurring. Next, paint spraying and film coating is performed. But the surface of the magnesium alloy casing is covered by a plurality of film layers, it is thus difficult to maintain the metallic texture of the magnesium alloy casing.

SUMMARY

The disclosure provides a manufacturing method of a casing featuring a simple manufacturing process and through which a metallic texture of the casing is maintained.

The disclosure further provides a casing presenting a favorable metallic texture.

The disclosure provides a manufacturing method of a casing including the following steps. A magnesium alloy substrate is provided first. Next, a protective film is formed on the magnesium alloy substrate. A grinding treatment, a cutting treatment, or an engraving treatment is then performed to remove portions of the protective film and portions of the magnesium alloy substrate. An electrophoretic coating treatment is performed afterwards to form a light-transmissive coating layer covering the protective film and the magnesium alloy substrate.

The disclosure provides a casing 100 including a magnesium alloy substrate, a protective film, a transparent conductive film, and a light-transmissive coating layer. The magnesium alloy substrate has a concave-convex surface. The protective film covers the convex surfaces of the concave-convex surface. The transparent conductive film covers the protective film and covers concave surfaces of the concave-convex surface. The light-transmissive coating layer is bonded to and covers the transparent conductive film.

To sum up, after the protective film is formed on the magnesium alloy substrate, in the manufacturing method of the casing provided by the disclosure, portions of the protective film and portions of the magnesium alloy substrate are removed through the grinding treatment, the cutting treatment, or the engraving treatment. The electrophoretic coating treatment is performed afterwards to form the light-transmissive coating layer covering the protective film and the magnesium alloy substrate. The above manufacturing process may be easily performed, and the metallic texture of the casing is also maintained.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1 to FIG. 5 are schematic cross-sectional views of a manufacturing process of a casing according to an embodiment of the disclosure. First, with reference to FIG. 1, a magnesium alloy substrate 10 is provided. The magnesium alloy substrate 10 may be formed through thixomolding or die casting and the like, and an outer surface 11 of the magnesium alloy substrate 10 is substantially an even surface. Next, with reference to FIG. 2, a protective film 20 is formed on the outer surface 11 of the magnesium alloy substrate 10 through a micro-arc oxidation treatment or a conversion coating treatment, so that corrosion is prevented from being generated on the magnesium alloy substrate 10.

Figure 1:
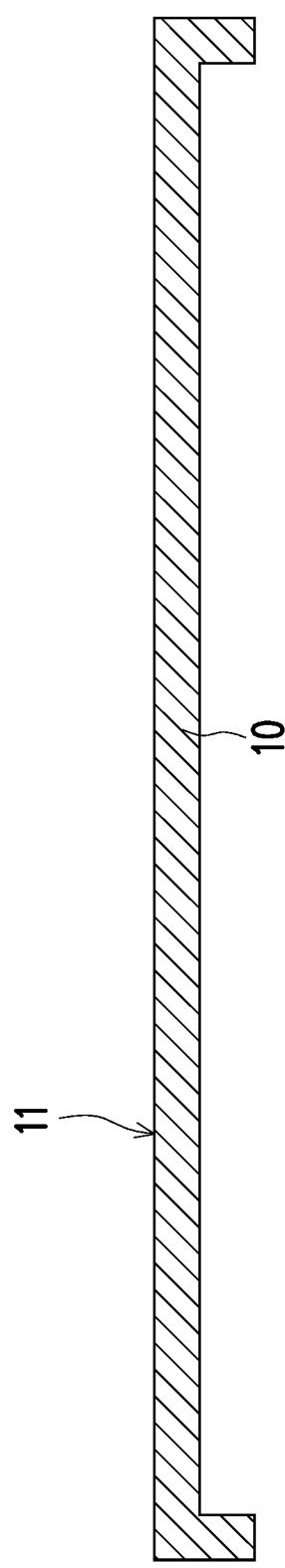
FIG. 1 to FIG. 5 are schematic cross-sectional views of a manufacturing process of a casing according to an embodiment of the disclosure.
Figure 2:
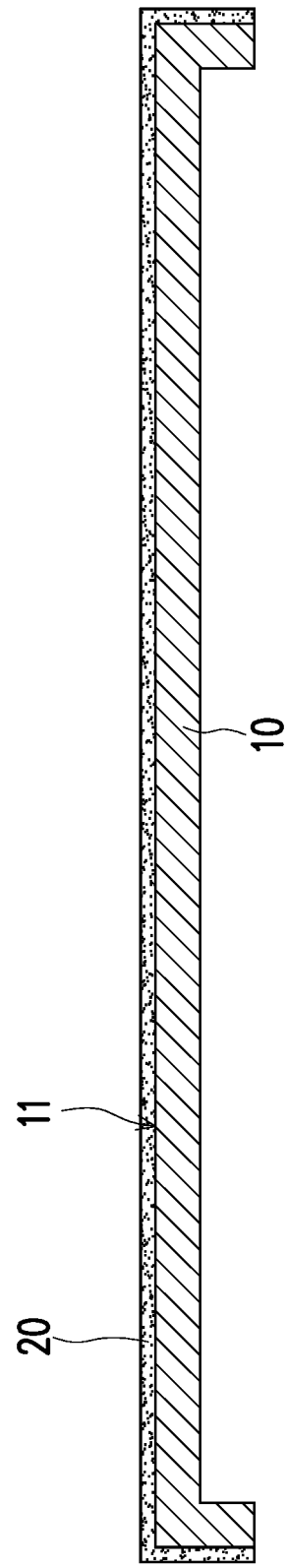
Figure 3:
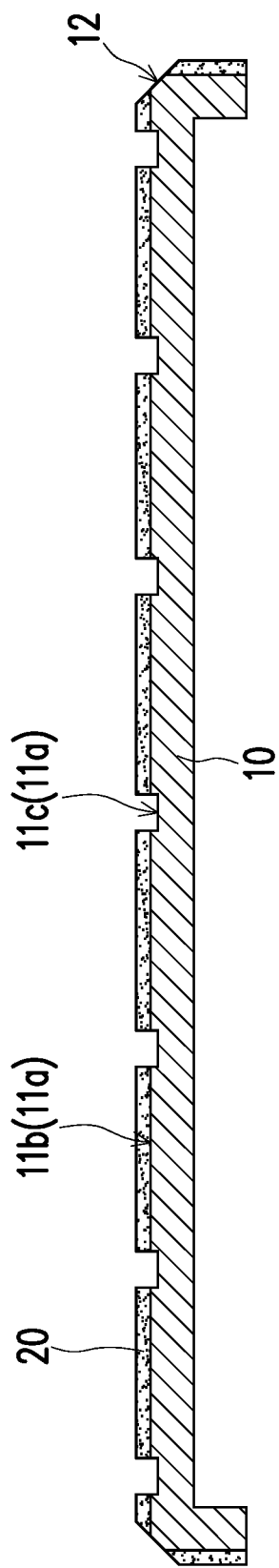

With reference to FIG. 3, a grinding treatment, a cutting treatment, or an engraving treatment is then performed to remove portions of the protective film 20 and portions of the magnesium alloy substrate 10. To be specific, blocks being removed in the protective film 20 overlap blocks being removed in the magnesium alloy substrate 10, and since portions of the magnesium alloy substrate 10 are removed, the outer surface 11 forms a concave-convex surface 11a. To be more specific, the concave-convex surface 11a includes a plurality of convex surfaces 11b and a plurality of concave surfaces 11c. The protective film 20 covers the plurality of convex surfaces 11b, and the plurality of concave surfaces 11c are exposed to the outside. Further, the plurality of convex surfaces 11b and the plurality of concave surfaces 11c are arranged in an alternating manner.

In particular, a height of each convex surfaces 11b is identical to a height of the original outer surface 11, and a height of each concave surfaces 11c is lower than the height of the original outer surface 11.

For instance, a brushed finishing treatment may be adopted for the grinding treatment, a drilling treatment may be adopted for the cutting treatment, and a laser engraving treatment may be adopted for the engraving treatment. The above processing methods may be adopted depending on the metallic texture to be presented and is not particularly limited in the disclosure.

As shown in FIG. 3, a corner of the outer surface 11 may be removed through the drilling treatment to form a chamfer surface 12. At the same time, a portion of the protective film 20 on the corner of the outer surface 11 is also removed, so that the chamfer surface 12 is exposed to the outside.

Figure 4:
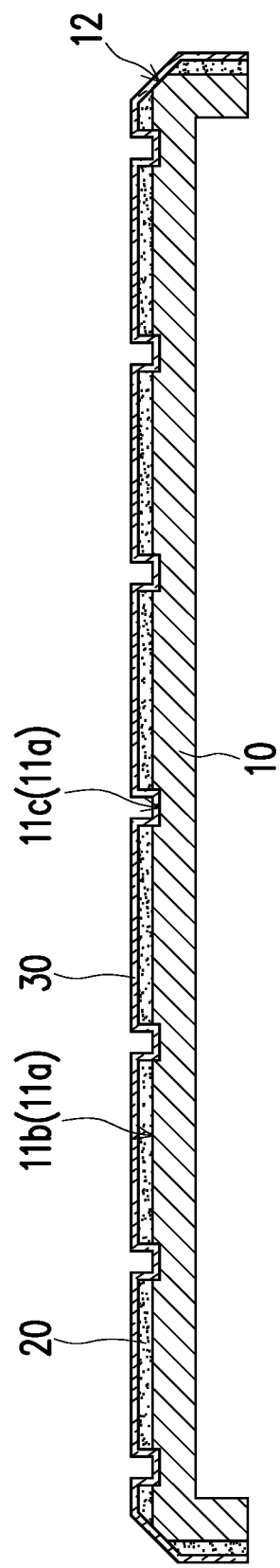

Next, with reference to FIG. 4, a transparent conductive film 30 is formed on the portions of the magnesium alloy substrate 10 which are exposed to the outside and the protective film 20 through a physical vapor deposition (PVD) technique or a chemical vapor deposition (CVD) technique and the like. A material of the transparent conductive film 30 may be a transparent conductive oxide (TCO). In detail, the transparent conductive film 30 is formed on the protective film 20, the plurality of concave surfaces 11c, and the chamfer surface 12 to cover the protective film 20, the plurality of concave surfaces 11c, and the chamfer surface 12. In addition, a contour of the transparent conductive film 30 is approximately similar to or identical to an outer contour of the protective film 20, outer contours of the plurality of concave surfaces 11c, and an outer contour of the chamfer surface 12.

Figure 5:
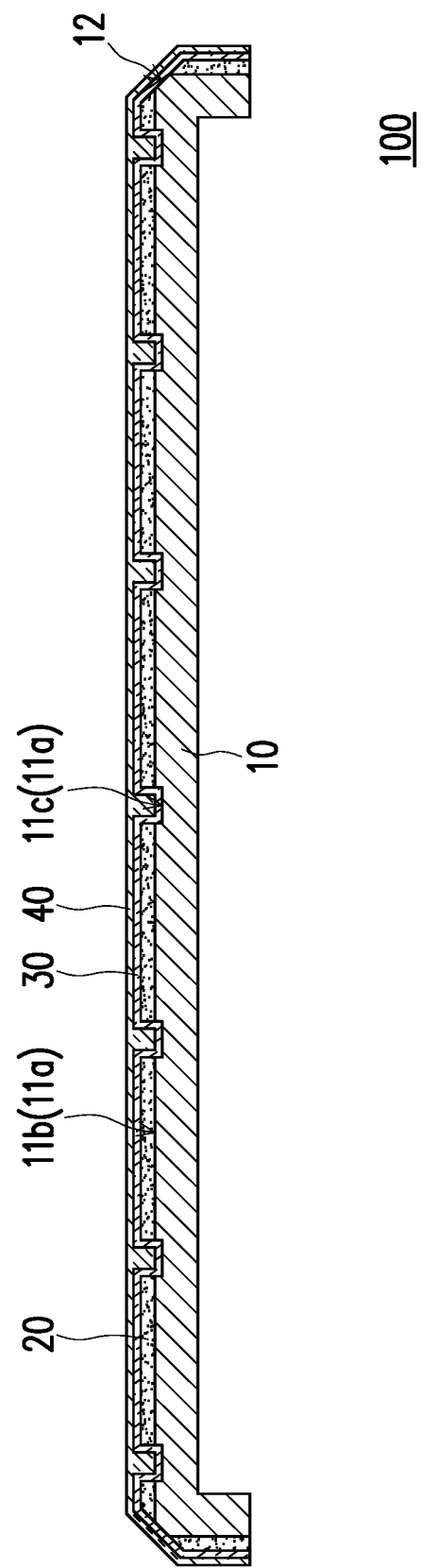

Finally, with reference to FIG. 5, light-transmissive electrophoretic paint is adopted to perform an electrophoretic coating treatment. Herein, an adhesion effect produced by the light-transmissive electrophoretic paint may be improved through the transparent conductive film 30. The light-transmissive electrophoretic paint may be formed by modulating transparent electrophoretic paint and electrophoretic color paste. After execution of the electrophoretic coating treatment is completed, a light-transmissive coating layer 40 is formed on the transparent conductive film 30. To be specific, the light-transmissive coating layer 40 is bonded to and covers the transparent conductive film 30, so as to indirectly cover the protective film 20 and the magnesium alloy substrate 10. Manufacturing of the casing 100 is completed so far, and it can be seen that the above manufacturing process may be performed easily.

Specifically, portions of the magnesium alloy substrate 10 are not covered by the protective film 20 but are covered by the light-transmissive coating layer 40 and the transparent conductive film 30. Both the light-transmissive coating layer 40 and the transparent conductive film 30 allow a light ray to pass through. As such, an external light ray may be projected to the concave surfaces 11c and the chamfer surface 12 of the magnesium alloy substrate 10 through the light-transmissive coating layer 40 and the transparent conductive film 30 and then is reflected to the outside from the concave surfaces 11c and the chamfer surface 12 of the magnesium alloy substrate 10. In this way, the metallic texture and metallic luster of the casing 100 is presented or maintained.

With reference to FIG. 5, in this embodiment, the casing 100 may be a magnesium alloy casing and includes the magnesium alloy substrate 10, the protective film 20, the transparent conductive film 30, and the light-transmissive coating layer 40. The magnesium alloy substrate 10 has the concave-convex surface 11a and the chamfer surface 12. Moreover, the protective film 20 covers the convex surfaces 11b of the concave-convex surface 11a but does not cover the chamfer surface 12 nor the concave surfaces 11c of the concave-convex surface 11a. The transparent conductive film 30 covers the protective film 20 and covers the chamfer surface 12 and the concave surfaces 11c of the concave-convex surface 11a. The light-transmissive coating layer 40 is bonded to and covers the transparent conductive film 30, so as to indirectly cover the protective film 20 and the magnesium alloy substrate 10.

Both the light-transmissive coating layer 40 and the transparent conductive film 30 allow a light ray to pass through. As such, an external light ray may be projected to the concave surfaces 11c and the chamfer surface 12 of the magnesium alloy substrate 10 through the light-transmissive coating layer 40 and the transparent conductive film 30 and then is reflected to the outside from the concave surfaces 11c and the chamfer surface 12 of the magnesium alloy substrate 10. In this way, the metallic texture and metallic luster of the casing 100 is presented or maintained. Note that in another embodiment, the magnesium alloy substrate has the concave-convex surface but does not include the chamfer surface. In another embodiment, the light-transmissive coating layer may directly cover the protective film and blocks in the magnesium alloy substrate not covered by the protective film. That is, the casing does not include the transparent conductive film.

In view of the foregoing, after the step of performing the micro-arc oxidation treatment or the conversion coating treatment is completed, in the manufacturing method of the casing provided by the disclosure, portions of the protective film and portions of the magnesium alloy substrate are removed through the grinding treatment, the cutting treatment, or the engraving treatment. Next, the transparent conductive film is formed on the protective film and the magnesium alloy substrate. The electrophoretic coating treatment is performed afterwards to form the light-transmissive coating layer covering the protective film and the magnesium alloy substrate. The light-transmissive coating layer is bonded to the transparent conductive film, and adhesion may thus be enhanced. The above manufacturing process may be easily performed, and the metallic texture of the casing is also maintained.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a casing, comprising:
   providing a magnesium alloy substrate having an outer surface;
   forming a protective film on the magnesium alloy substrate;
   performing a grinding treatment, a cutting treatment, or an engraving treatment to remove portions of the protective film and portions of the magnesium alloy substrate, wherein the outer surface of the magnesium alloy substrate forms a concave-convex surface having convex surfaces covered by the protective film and concave surfaces exposed to outside; and
   performing an electrophoretic coating treatment to form a light-transmissive coating layer covering the protective film and the magnesium alloy substrate, wherein a thickness of portions of the light-transmissive coating layer located on the convex surfaces is smaller than a thickness of other portions of the light-transmissive coating layer located on the concave surfaces.

2. The manufacturing method of the casing according to claim 1, wherein the grinding treatment includes a brushed finishing treatment.

3. The manufacturing method of the casing according to claim 1, wherein the cutting treatment includes a drilling treatment.

4. The manufacturing method of the casing according to claim 3, wherein the portions of the magnesium alloy substrate are removed through the drilling treatment.

5. The manufacturing method of the casing according to claim 1, wherein the engraving treatment includes a laser engraving treatment.

6. The manufacturing method of the casing according to claim 1, wherein the method of forming the protective film on a surface of the magnesium alloy substrate includes a micro-arc oxidation treatment or a conversion coating treatment.

7. The manufacturing method of the casing according to claim 1, further comprising:
   forming a transparent conductive film on the protective film and the magnesium alloy substrate before performing the electrophoretic coating treatment, wherein the light-transmissive coating layer is bonded to and covers the transparent conductive film.

* * * * *